(12) United States Patent
Tenhumberg et al.

(10) Patent No.: US 12,140,297 B2
(45) Date of Patent: Nov. 12, 2024

(54) ESD PROTECTION OF CHIP SCALE PACKAGE LEDS

(71) Applicant: SIGNIFY HOLDING B.V., Eindhoven (NL)

(72) Inventors: Christian Tenhumberg, Vreden (DE); Dmytro Viktorovych Malyna, Achel (BE); Eugen Jacob De Mol, Eindhoven (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 18/288,771

(22) PCT Filed: May 12, 2022

(86) PCT No.: PCT/EP2022/062947
§ 371 (c)(1),
(2) Date: Oct. 27, 2023

(87) PCT Pub. No.: WO2022/243169
PCT Pub. Date: Nov. 24, 2022

(65) Prior Publication Data
US 2024/0219011 A1    Jul. 4, 2024

(30) Foreign Application Priority Data
May 21, 2021 (EP) ..................... 21175180

(51) Int. Cl.
*F21V 23/00* (2015.01)
*F21V 29/71* (2015.01)
(Continued)

(52) U.S. Cl.
CPC .......... *F21V 23/005* (2013.01); *F21V 29/713* (2015.01); *H05K 1/115* (2013.01); *F21Y 2103/10* (2016.08); *F21Y 2115/10* (2016.08); *H05K 1/0306* (2013.01); *H05K 2201/10015* (2013.01)

(58) Field of Classification Search
CPC ..... F21V 23/005; F21V 29/713; H05K 1/115; H05K 1/0306; H05K 2201/10015; F21Y 2103/10; F21Y 2115/10
See application file for complete search history.

(56) References Cited

U.S. PATENT DOCUMENTS 9,516,720 B2 * 12/2016 Malyna ................ H01L 33/642
2007/0242462 A1   10/2007 Van Laanen et al.
(Continued)

FOREIGN PATENT DOCUMENTS

JP    2010245054 A    10/2010
WO   2015063310 A2    5/2015
(Continued)

*Primary Examiner* — Bao Q Truong

(57) ABSTRACT

The invention relates to a lighting apparatus for coupling to an LED driver. The lighting apparatus comprises a plurality of LEDs in a series connection arranged to form an LED string having a first end and a second end, a heatsink thermally coupled to the LED string, wherein the heatsink is electrically conductive, a capacitor coupled between the first end of the LED string and the heatsink and an electrical connection between the second end of the LED string and the heatsink.

14 Claims, 4 Drawing Sheets

(51) Int. Cl.
*H05K 1/11* (2006.01)
*F21Y 103/10* (2016.01)
*F21Y 115/10* (2016.01)
*H05K 1/03* (2006.01)

(56) References Cited

U.S. PATENT DOCUMENTS

2016/0270161 A1  9/2016  Malyna et al.
2019/0368710 A1* 12/2019  Zhang .................... H05B 45/39

FOREIGN PATENT DOCUMENTS

| WO | 2015063310 A3 | 7/2015 |
| WO | 2018099791 A1 | 6/2018 |

\* cited by examiner

ESD PROTECTION OF CHIP SCALE PACKAGE LEDS

CROSS-REFERENCE TO PRIOR APPLICATIONS

This application is the U.S. National Phase application under 35 U.S.C. § 371 of International Application No. PCT/EP2022/062947, filed on May 12, 2022, which claims the benefit of European Patent Application No. 21175180.5, filed on May 21, 2021. These applications are hereby incorporated by reference herein.

FIELD OF THE INVENTION

The invention relates to a lighting apparatus. The invention further relates to a lighting system.

BACKGROUND OF THE INVENTION

Human beings are very good charge generators because they are insulators and touch a lot of surfaces, which generates static electrical energy. By walking, human beings generate a static electricity, which is slowly discharged to the ground. When a person, who is electrostatically charged, touches an electric component, the static electricity, i.e. the static charge, will discharge into the electric component with a great risk of damaging or destroying the electric component. This phenomenon is well known as an electrostatic discharge, ESD.

In literature, a human body has an electric equivalent circuit with a resistance of 1500Ω and a capacitance of 150 pF. ESD events can generate a lot of energy with high voltage and high current. When ESD damages LEDs on an LED board, it becomes very difficult to estimate then the lifetime of the LED board. An ESD weakens up the LED board and impacts the reliability.

Most of Chip Scale Package, CSP, LED boards do not have an ESD protection.

An additional risk for CSP LEDs, due to the lack of any ESD protection, or even with an ESD protection, is that they are susceptible for a surge. This surge occurs when e.g. a large load turns on or off in the mains grid. A surge is a representation of a voltage and a current that occur in a very short time duration with high amplitudes in the range of 10 kV and 1 kA. The surge may last for e.g. 2.5 μs to 20 μs and contains a lot of energy in this short time duration. The surge is then also present at the input of an LED driver that powers the LED board. When there is no or insufficient surge protection provided by the LED driver, the surge will reach the LED board and potentially damage the LEDs on the LED board by releasing the surge energy in the LEDs or LED board.

It is desired to prevent the LEDs from getting damaged by the ESD and the surge.

SUMMARY OF THE INVENTION

It is an objective of the invention to provide a lighting apparatus that is more resistant to surges and ESD.

To overcome this concern, in a first aspect of the invention, a lighting apparatus is provided. The lighting apparatus comprises:
a plurality of LEDs in a series connection arranged to form an LED string having a first end and a second end;
a heatsink thermally coupled to the LED string, wherein the heatsink is electrically conductive;
a capacitor coupled between the first end of the LED string and the heatsink;
an electrical connection between the second end of the LED string and the heatsink.

By coupling both ends of the LED string to the electrically conductive heatsink, the surge can be carried away from the LEDs via the heatsink through a parasitic capacitive path back to the source of the surge. Because the heatsink is electrically conductive and both ends of the LED string are coupled to it, it is not possible to couple both ends directly to the heatsink. One end of the LED string may be coupled electrically directly to the heatsink while the other end is electrically coupled to the heatsink via a capacitor. When a surge arrives at the LED string, e.g. via an LED driver, the surge is directly diverted via the capacitor or the direct connection to the heatsink and back to the source of the surge. More details on this subject will be provided in the detailed description.

In a further example, the lighting apparatus comprises a printed circuit board, PCB, wherein the LED string and the capacitor are mounted on the PCB.

Preferably, the LEDs and the capacitor are mounted on a PCB. Preferably the LEDs are of the type of Chip Scale Package, CSP, LEDs because these can be very well integrated on the PCB. Preferably, the capacitor is a surface mounted device, SMD, capacitor which may for example be made of ceramic. The use of a PCB for mounting the LEDs and capacitor onto provides a robust and easy way to create an LED board which can be easily coupled to an LED driver.

In a further example, the LED string and the capacitor are mounted on one side of the PCB and the heatsink is mounted on another side of the PCB.

An easy design for the lighting apparatus is to have all components on a single side of the PCB. The other side of the PCB can be used to be provided with or coupled to a heatsink. An example of such a heatsink can be a plane of copper or an electrical conductive layer on the PCB, which is deposited on the other side of the heatsink. This plane can cover the entire other side of the PCB. Alternatively, this plane can have small interruptions, while being electrically connected in total, to prevent or reduce eddy currents flowing through this plane. Alternatively, the plane can be placed only below the sources of heat, which are in this example the LEDs. This would for example result in a plane below each of the LEDs while each plane is then interconnected to provide a single electrically connected plane.

In a further example, the lighting apparatus comprises an electrical insulating, and thermal conductive layer coupled to the heatsink and adapted to be coupled to a housing. To provide an optimum thermal path, it is preferred to thermally couple the LEDs to the housing so that heat can be transferred optimally to the ambient. Due to the different voltage levels and the fact that no voltage may be present at the housing itself for human safety, electrical isolation needs to be provided between the heatsink, which may be directly coupled to one of the first end or second end of the LED string and therefore also has this voltage potential, and the housing. Just as important, this electric insulator needs to be able to provide a good thermal coupling between the heatsink and the housing. This electric isolation and good thermal coupling can be provided by a gap pad or a ceramic material. A gap pad is a soft material having good electric insulating parameters and good thermal conductive parameters.

In a further example, the electrical connection between the first end of the LED string and the heatsink comprises a via from the first end of the LED string to the heatsink.

When the LEDs and the capacitor are mounted on one side of the PCB and the heatsink is mounted on the other side of the PCB, the best way to transfer the heat through the PCB is by using one or more vias. Preferably more vias are used to optimize the heat transfer. These vias are referred to as thermal vias. The via is used to electrically connect the second end of the LED string with the heatsink. The via therefore provides an electrical as well as a thermal coupling between the second end and the heatsink.

In a further example, the capacitor is electrically coupled to the heatsink using a via.

The use of a via for electrically coupling the capacitor to the heatsink is preferred because this provides the most optimum electrical connection because this connection is the shortest possible connection with the least parasitic effects possible.

In a further example, the PCB is a ceramic PCB.

The use of a ceramic PCB provides additional benefits. The ceramic PCB is electrically insulating and thermally very good conductive. This results in that less vias would be needed because the vias do not need to provide for thermal conductivity but at least for electrical conductivity. Another benefit of the use of ceramics for the PCB is that the entire PCB can be used for spreading the heat over the entire surface of the PCB and therefore also to the entire surface of the heatsink. This means that the LEDs serving as thermal hotspots have an improved heat distribution over the PCB. In fact, the ceramic CPB and the heatsink can in total be used for sinking the heat to the environment. This allows that the PCB and heatsink do not have to be thermally connected to the housing, i.e. the heatsink is disconnected from the housing.

In a further example, the heatsink is a single entity arranged to be thermally coupled to all of the LEDs of the plurality of LEDs.

Preferably, the heatsink is a single copper plane that covers the other side of the PCB, i.e. the side where no components are present. The heatsink is in this way easy to make.

In a further example, the lighting apparatus comprises a further capacitor, wherein the heatsink is coupled to a ground return path via the further capacitor.

When the heatsink is directly coupled to the ground return path with the further capacitor, the surge or ESD will have a dedicated path for the currents to flow. This provides more certainty on how the currents will flow compared to using the parasitic capacitances from the ambient, especially when there is no other path back to ground i.e. no housing is present for providing a path to ground.

In a further example, the heatsink comprises a copper plane.

A copper plane is very easy to deposit on one side of the PCB.

In another example a lighting system is provided. The lighting system comprises the lighting apparatus and an LED driver for providing a regulated current to the lighting apparatus.

A lighting system such as a lamp or luminaire benefits from the protection against surges. An LED driver is normally directly connected to mains, where surges can occur. This LED driver may not sufficiently be protected against surges because LED drivers may be designed to be small and cheap. The LEDs in the lighting apparatus are with the invention protected against a surge because the surge is bypassed from the LEDs. In addition, the LEDs are also better protected against ESD.

In another example, the LED driver is arranged to provide a galvanic isolation between an input of the LED driver and an output of the LED driver, wherein the output of the LED driver is coupled to the LED string and the input of the LED driver is coupled to a mains voltage supply, wherein the LED driver comprises an isolation capacitor placed across the galvanic isolation.

The driver can be used to provide galvanic isolation. The lighting apparatus is galvanically isolated from the mains input. This allows the lighting apparatus to be operated with for example a safety extra-low voltage, SELV. This allows the user to touch the LEDs without the risk of getting an electric shock. By touching the LEDs, the user introduces ESD risks, which are reduced by the invention. A Y-capacitor is normally placed across the galvanic isolation to reduce electromagnetic interference, EMI created by the LED driver. This capacitor allows a surge to cross the galvanic isolation barrier and cause damage to the LEDs. This surge bypasses the LEDs by the implementation of the invention.

In another example, the lighting system comprises a housing. A housing can be used to provide a total encapsulation of the LED driver and the lighting apparatus.

In another example, the housing is an electrical conducting housing, and the housing is coupled to ground.

An electrical conducting housing such as a metal housing can be used to provide the encapsulation of the driver and the lighting apparatus and also provide thermal benefits because metal is a good thermal conductor. To provide human safety, this electrical conducting housing is coupled to a protective earth.

BRIEF DESCRIPTION OF THE DRAWINGS

Examples of the invention will now be described with reference to the accompanying drawings, in which.

DETAILED DESCRIPTION OF THE EMBODIMENTS

Figure 1:
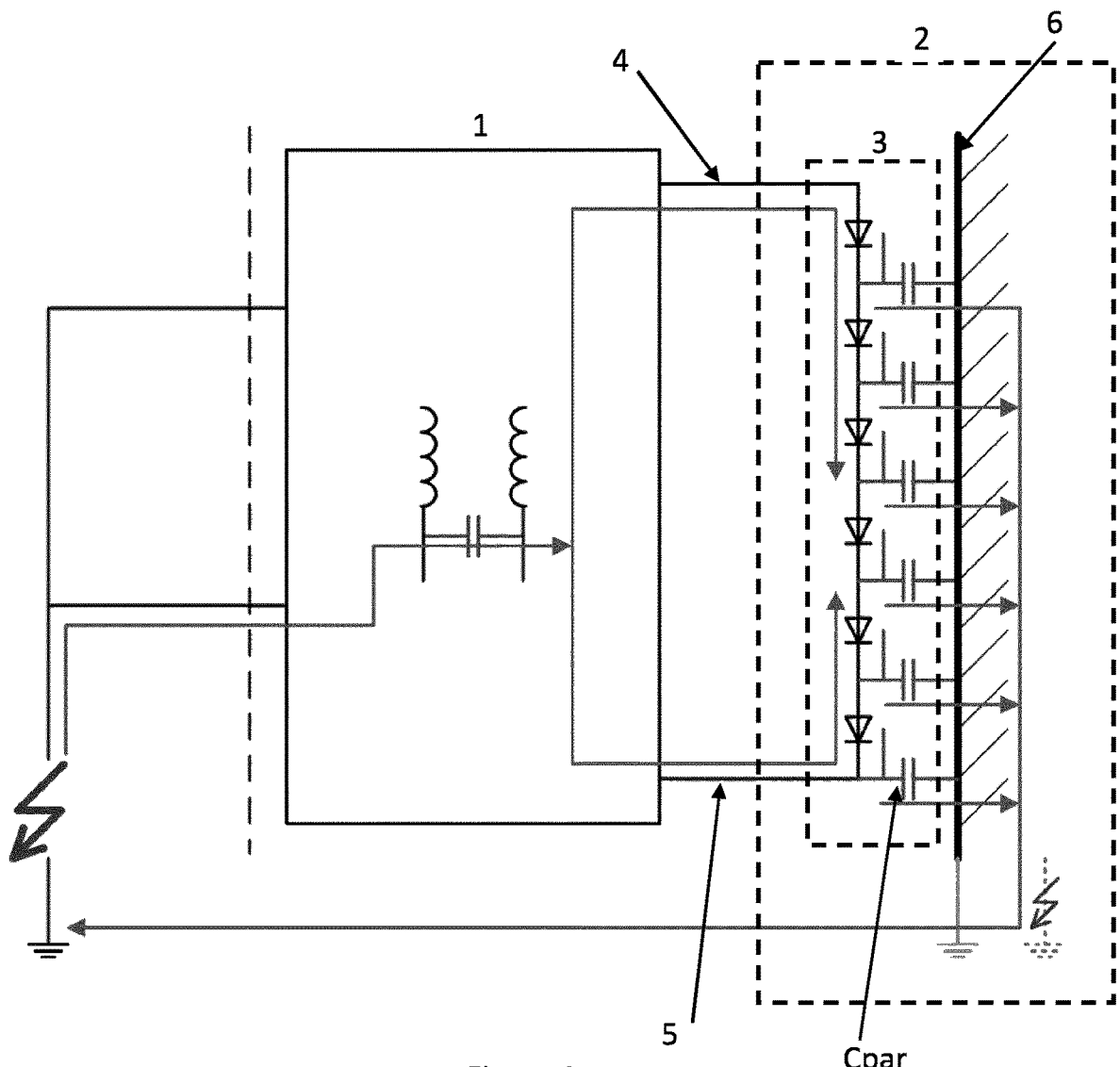
FIG. 1 shows an example of a lighting system according to the common practice.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus and systems of the present invention will become better understood from the following description, appended claims, and accompanying drawings. It should also be understood that the Figures are merely schematic and are not drawn to scale. It should also be understood that the same reference numerals are used throughout the Figures to indicate the same or similar parts.

FIG. 1 shows an example of a lighting system as commonly used. In FIG. 1, an LED driver 1 is used to provide a regulated power to a lighting apparatus 2. The driver is coupled at its input to mains. Mains can be for example 230 V at 50 Hz or 120 V at 60 Hz. The LED driver 1 converts this mains voltage to a desired output voltage and current such that the lighting apparatus 2 provides the desired light output. The desired light output may be set by a user or may be preconfigured in the LED driver. The lighting apparatus 2 has a plurality of LEDs coupled in a series configuration. These LEDs form an LED string 3. The LED string 3 has a first end 4 and a second end 5 to which the lighting apparatus 2 is electrically coupled to the LED driver 1. The first end 4 is not electrically coupled to the heatsink 6. The second end 5 is coupled to the heatsink 6 via a parasitic capacitor Cpar. This circuit provides a very low grade of protection from a surge or ESD.

A surge occurs at the mains input side. This can for example happen when a large load such as an electric machine, refrigerator or washing machine is suddenly turning on or off. A large voltage and current spike are applied at the input of the LED driver 1. The LED driver 1 passes on this surge voltage to its output. This can happen in several ways. The surge can be provided in a differential mode way or a common mode way. In a differential mode surge, the surge occurs between line and neutral. In a common mode surge, the surge occurs between either line or neutral and protective earth, i.e. ground. In any situation, the surge is provided to either the first end 4 or the second end 5 and therefore to the LEDs. In the situation of a differential mode surge, the surge will flow from the first end 4 to the second end 5 or vice versa. In the situation of the common mode surge, the surge will flow from either the first end 4 or the second end 5 to the protective earth. Because there is no protective earth connection at the LED string 3 itself, the surge will have to find another path to protective earth. This path can be found via the heatsink 6 because the heatsink 6 serves as the largest parasitic capacitance available to the protective earth.

The first end 4 is coupled to the heatsink 6 via the first LED in the LED string 3. This means that any surge coming from the first end 4 will always flow through the first LED in the LED string 3. This will lead to a damaged first LED or even a broken first LED.

The second end 5 is only coupled to the heatsink 6 via a parasitic capacitance Cpar. This capacitance is however insufficient to provide an impedance low enough to allow the entire surge to flow through the parasitic capacitance Cpar. This results in that a part of the surge flows in the last LED of the LED string 3. This means that any surge coming from the second end 5 will always flow through the last LED in the LED string 3. This will lead to a damaged last LED or even a broken last LED.

ESD has a similar behavior with respect to surges with a major difference of where the source is positioned. The human body touching the lighting apparatus 2 acts as the source. The human body can touch the lighting apparatus 2 anywhere. Therefore, multiple current paths can be possible. Each current path is directed towards the protective earth so each ESD will discharge towards the heatsink 6. It is therefore important that the LEDs are bypassed in any situation. In the example provided in FIG. 1, the first end 4 is only coupled to the heatsink 6 via the top LED which poses a risk for ESD damages for at least the top LED.

It is therefore desired that the lighting system is better protected against surges and ESD.

Figure 2A:
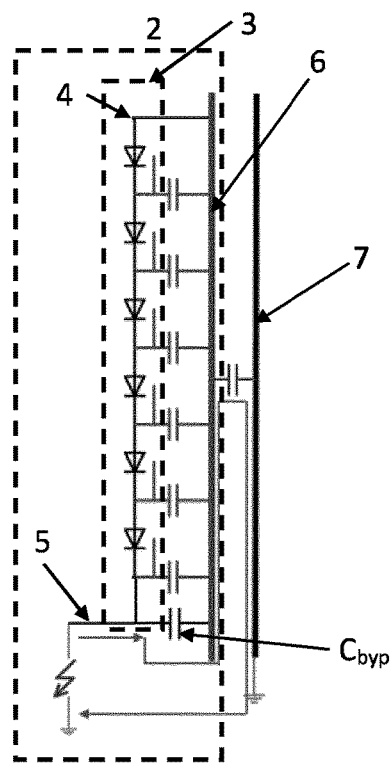
FIGS. 2a, 2b and 2c show examples of surges flowing through the lighting apparatus.
Figure 2B:
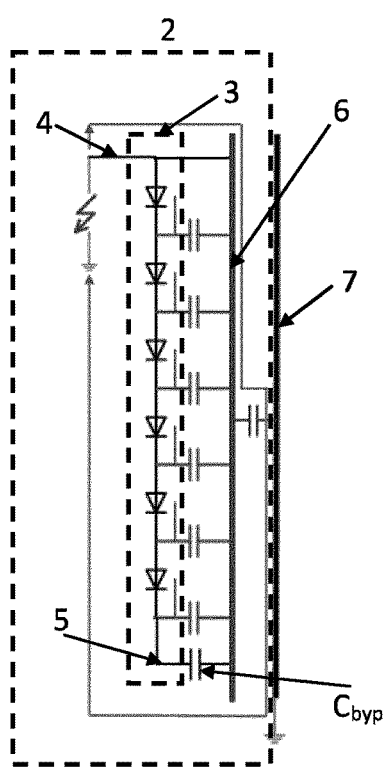
Figure 2C:
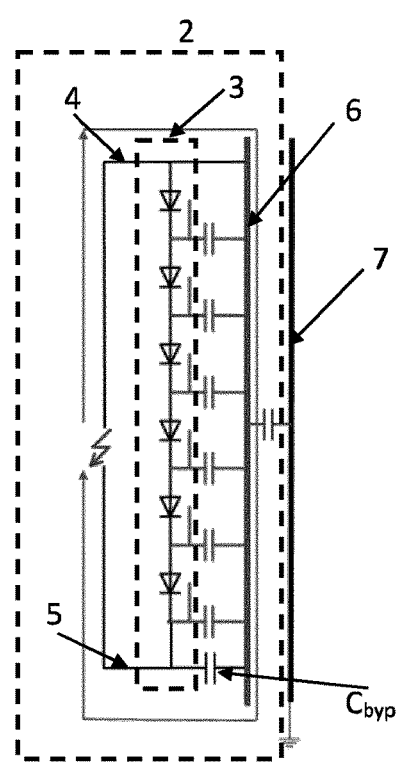

In FIGS. 2a, 2b and 2c, an example of a lighting apparatus 2 according to the invention is shown and the functionality of the example is explained.

The lighting apparatus 2 has an LED string 3. In this example, six LEDs are coupled in series. It is to be understood that any number of LEDs can be coupled in series. In addition, additional LEDs can be placed in parallel with the LED strings 3 such that multiple LED strings can be formed or that a single LED string 3 can have multiple parallel LEDs coupled in series.

The lighting apparatus 2 may be coupled to the LED driver 1. The first end 4 may be used to connect a first output of the LED driver 1 to the input of the lighting apparatus 2, i.e. the anode of the first LED in the LED string 3. The second end 5 may be used to connect a second output of the LED driver 1 to the output, or return, side of the lighting apparatus 2, i.e. the cathode of the last LED in the LED string 3. The LEDs can be mounted on a printed circuit board, PCB. This PCB can be an electric non-conductive PCB. This PCB provides a platform for the LEDs, capacitors and interconnections to be mounted on. The LEDs consume a relatively large amount of power on a small surface. This means that a lot of heat is generated which needs to be removed. A heatsink 6 is used for this purpose. The heatsink 6 is thermally and electrically conductive. In this example, the LEDs of the LED string 3 are mounted on one side of the PCB. The heatsink 6 is mounted on the other side of the PCB. The heatsink 6 may be placed opposing, e.g. on the other side of the PCB, all the LEDs such that it provides a heatsinking effect for all of the LEDs. Similar as in the lighting system of FIG. 1, a parasitic capacitive coupling is present between each LED and the heatsink 6. Each relevant parasitic capacitance for this parasitic coupling is represented as a capacitance from the cathode of each LED to the heatsink 6. In this example, the parasitic capacitances are created by pads of the LEDs (thermal or electrical connection pads) and the heatsink 6, which act as the electrodes of the parasitic capacitances. The PCB is present between the pads and the heatsink 6 and therefore functions as the dielectric of the parasitic capacitances. It is to be understood that the configuration can be slightly different but with a similar effect. When a metal core printed circuit board, MCPCB, is used, the LEDs need to be electrically isolated from the MCPCB to avoid short circuits. The isolator for isolating the LEDs from the MCPCB acts as the dielectric for the parasitic capacitances. The pads, similar to the situation with the non-metal core PCB, and the heatsink 6, which is in this case the MCPCB, act as the electrodes of the parasitic capacitances.

The heatsink 6 may be coupled to a housing 7. This housing 7 may be electrically and thermally conductive. With a good thermal coupling between the LEDs and the housing 7, the heat generated by the LEDs can be transferred to the ambient in a very efficient way.

During normal operation of the lighting system, the parasitic capacitances are harmless in respect of the safety of the LEDs. However, in the event of a surge or an electrostatic discharge, ESD, the situation becomes different and a risk of damaging the LEDs is present.

In FIG. 2a, a common mode surge is shown that occurs from the second end 5 and flows through the heatsink 6 to the ground. The surge will flow through the last parasitic capacitance shown as the lowest parasitic capacitance in FIG. 2a. If this capacitance value is too low, which is the case in this example because the capacitance is a parasitic capacitance in the pF range, the current will also flow through the last LED and the parasitic capacitance at the anode of the last LED. The last LED will be damaged in the process by the surge or at least a fraction of the surge flowing through the last LED in reverse direction.

To prevent a surge from the second end 5 to the heatsink 6 from damaging at least the last LED, a capacitor $C_{byp}$ is placed between the second end 5 and the heatsink 6. This capacitance $C_{byp}$ provides enough capacitance to provide a low impedance path for the surge to flow to the heatsink 6 without flowing through any of the LEDs.

In this situation, it is assumed that the heatsink 6 itself provides enough parasitic capacitance to the ground to provide a path for the surge to flow from the heatsink 6 to the ground.

If the heatsink 6 is thermally coupled to the housing 7, the surge will flow from the heatsink 6 via a parasitic capacitive coupling to the housing 7 and to the ground. The housing 7 may be electrically coupled to the ground, providing a low impedance path to ground.

Alternatively, instead or together with the housing 7, a further capacitor $C_{gnd}$ can be coupled between the heatsink 6 and the ground. In many situations, the LED driver 1 is powered with a mains voltage. The mains voltage is provided via a Line and a Neutral input. In addition with these two inputs, an additional input may be provided, namely ground. Ground may also be called protective earth, PE or earth. The purpose of the ground connection is to electrically connect metal parts or surfaces that would be otherwise be floating to ground such that a user is protected from an electric shock when touching the metal parts or surfaces.

The ground connection can be provided via the LED driver 1 to the lighting apparatus 2. A capacitive connection can then be established between the ground input and the heatsink 6 using the further capacitor $C_{gnd}$. This may not be enough to protect a user against electric shocks when touching the heatsink 6, but it does protect the LEDs against surges and ESD. To protect the user from electric shock from the heatsink 6, a housing 7 can be provided which is directly electrically connected to ground. This electric connection can be established with the same ground input provided by the LED driver 1.

FIG. 2*b* shows a similar lighting apparatus 2 as in FIG. 2*a*. In FIG. 2*b*, a common mode surge flows from the first end 4 to the heatsink 6. By electrically coupling the first end 4 to the heatsink 6, the surge will bypass the LEDs and directly flow to the heatsink 6. From there, the surge flows directly or indirectly back to ground.

The surges represented in FIGS. 2*a* and 2*b* are represented as common mode surges, which have to flow back to ground.

In FIG. 2*c*, a lighting apparatus 2, similar to the lighting apparatus of FIGS. 2*a* and 2*b* is shown. The surge occurs from the first end 4 to the second end 5 or vice versa.

The direct electric connection of the first end 4 to the heatsink 6, and the capacitive connection of the second end 5 to the heatsink 6 provides a shunt path for high frequency currents, such as a surge. The LED string 3 is in fact bypassed via the heatsink 6 when a transient such as a surge or ESD approaches the LEDs.

The use of a direct connection between the first end 4 and the heatsink 6 and the capacitive connection between the second end 5 and the heatsink 6 protects the LED string 3 against common mode and differential mode surges.

This circuit also provides an improved protection for the LEDs against ESD. The ESD can occur when a user touches any of the LEDs at any place in the LED string 3. The ESD wants to discharge the charge from a human body, touching the LED, to ground. This can even occur when the lighting apparatus 2 is not connected to the LED driver 1. The ESD follows the same discharging path as the surge. When a user touches the first end 4 or the second end 5, the ESD is bypassed from the LED string 3 to the heatsink 6.

Figure 3:
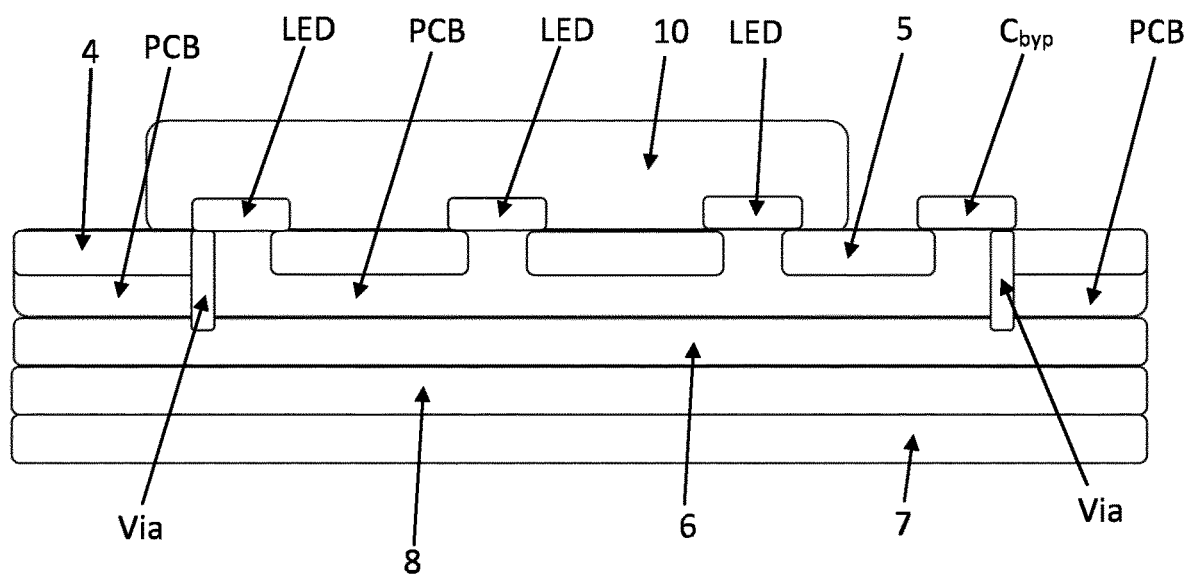
FIG. 3 shows an example of a layout of the lighting apparatus according to the invention.

In FIG. 3, an example of a lighting apparatus 2 according to the invention is shown. A side view of the lighting apparatus 2 is shown, where the LEDs are mounted on a PCB. The LED string 3 is depicted as three LEDs coupled in series where the first LED is shown on the left and the last LED is shown in the right. The LEDs are coupled together using copper planes, which are mounted on a first side of the PCB. The first end 4 is represented as a copper plane on the left, to which an interconnection to the LED driver 1 can be made. The second end 5 is represented as a copper plane on the right, to which another interconnection to the LED driver 1 can be made. The PCB can be made of any commonly used material. The material can be any of the non-limitative list of examples: FR4, film substrate material for flexible PCBs, metal or ceramic. Preferably, the LEDs are covered with a coating 10 that prevents an ESD from happening at the LEDs themselves. An ESD can still occur on the first end 4 or the second end 5.

The use of a ceramic PCB provides additional benefits, similar to using a metal core PCB, namely that the PCB itself can act as a heat spreader due to its good thermal conductivity. On the contrary to an MCPCB, the ceramic is an electrically non-conductive material, which therefore does not provide a plane for a parasitic capacitance to the ambient and therefore ground. In addition, the components e.g. LEDs and bypass capacitor $C_{byp}$ can be directly mounted on the ceramic PCB without the need of an electrical insulator. This significantly improves the radiated EMI performance of the lighting apparatus 2 compared to an MCPCB. The LEDs and bypass capacitor $C_{byp}$ are placed on one side of the PCB. On the other side of the ceramic PCB, the heatsink 6 is provided. Because the ceramic PCB already provides a good thermal spreading and conductance, the heatsink 6 does not have to be volumetric. A copper plane on the other side of the ceramic PCB can already be sufficient, but any other heatsinks are still possible. A single copper plane can cover the entire other side of the ceramic PCB, but smaller planes are also possible to save on the amount of copper used. This copper plane acting as the heatsink 6 is then also electrically coupled to the first end 4 and capacitively coupled, via bypass capacitor $C_{byp}$ to the second end 5. Preferably, the ceramic PCB is disconnected from the housing 7 i.e., not thermally coupled to the housing 7. This further lowers the parasitic coupling of the lighting apparatus 2 to the environment, further improving radiated EMI.

Preferably, the first end 4 is electrically coupled to the heatsink 6 using a via. This via is an interconnection through the PCB from the layer where the first end 4 is positioned, in this example the first side of the PCB, to the heatsink. The via may be a metallized through hole connection directly electrically connecting the first end 4 with the heatsink 6. In the shown example, the bypass capacitor $C_{byp}$ is shown as an SMD capacitor that is placed on the same side as the LEDs. It is clear to the skilled person that this bypass capacitor $C_{byp}$ can also be placed elsewhere. In this example, the bypass capacitor can be electrically coupled to the cathode of the last LED using a copper plane or trace. The other end of the bypass capacitor $C_{byp}$ can be coupled to the heatsink 6 using a via. Additional thermal vias can be used for providing an improved thermal coupling between the two ends of the PCB. Depending on where these thermal vias are coupled to, e.g. a node between the first LED and the second LED in the LED string 3, an electric isolation may be required between the thermal via and the heatsink 6 because in this example, the heatsink 6 is at the same voltage potential as the first end 4. Using a ceramic PCB may omit the need for thermal via because of the good thermal properties of the ceramic material.

The heatsink 6 may be thermally coupled to the housing 7 using a thermal pad 8. This thermal gap pad can be any material that can be used to provide a solid thermal connection between the heatsink 6 and the housing 7 such as, but not limited to: thermal paste, thermal tape or gap fillers.

The housing 7 is preferably electrically coupled to ground so that the housing is set to a safe voltage potential.

Figure 4:
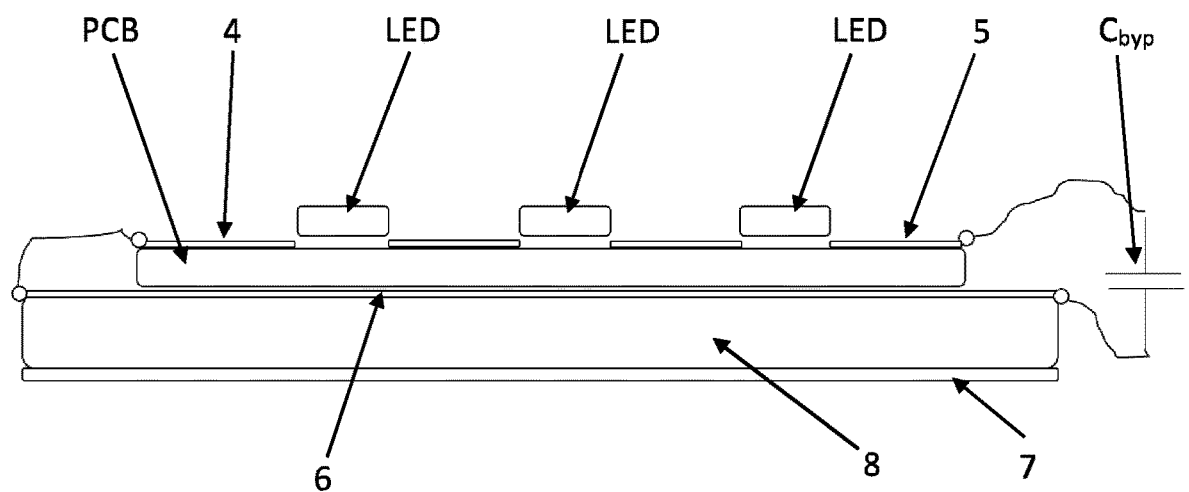
FIG. 4 shows another example of a layout of the lighting apparatus according to the invention.

FIG. 4 provides a detailed example of the invention. A lighting apparatus 2 is provided, which has an LED string 3, having three LEDs in series mounted on one side of the PCB. In addition, the first end 4 and the second end 5 are also mounted on the same side of the PCB. The PCB may be made of ceramic, providing a good thermal contact to the heatsink 6. The LED string 3 is mounted on one side and can be made replaceable, so a user can choose a desired PCB with a desired number of LEDs. The heatsink 6 may be an electrically conductive plane e.g. a copper plane. The heatsink 6 is coupled to the housing 7 using a thermal pad 8. The combination of the heatsink 6, thermal pad 8 and housing 7 can be an independent entity to which the PCB with the LED string 3 can be mounted. The heatsink 6 protects the gap pad 8 from being damaged when mounting the PCB to the heatsink 6. If the heatsink 6 can be made flexible, the thermal coupling between the PCB and heatsink can be optimized, i.e. airgaps are prevented or reduced.

In the example of FIG. 4, the connection between the first end 4 and the heatsink 6 is not done with a via. The connection is done with a wire or a bonding wire, which can be attached when the PCB is mounted on the heatsink 6. The bypass capacitor $C_{byp}$ is in this example a separate capacitor which is mounted between the second end 5 and the heatsink 6. Here, also wires or bonding wires can be used to connect the bypass capacitor $C_{byp}$ to the second end 5 and the heatsink 6.

In the examples provided, the first end 4 is represented as the top connection between the LED driver 1 and the lighting apparatus 2 and the second end 5 is represented as the bottom connection between the LED driver 1 and the lighting apparatus 2. It is to be understood that the first end 4 can be represented as the bottom connection between the LED driver 1 and the lighting apparatus 2 and the second end 5 can be represented as the top connection between the LED driver 1 and the lighting apparatus 2. This would mean that for example the capacitor CI can be placed at the bottom end or the top end.

The term one side and other side of the PCB relate to a PCB with only two sides. It is to be understood that a PCB can have multiple layers, resulting in more than two sides. It is clear from the description that in the case of multiple layers, that the one side is a different layer than the other side.

In the examples provided, the first electrically conductive element 6 is exemplified as a heatsink and the second electrically conductive element 7 as a housing. It is to be understood that these are to be considered as non-limiting examples and that these are only used in the examples for the sake of clarity. The heatsink is an example of a first electrically conductive element 6. The first electrically conductive element 6 may for example be an intermediate layer of an electric conductive material. The housing is an example of the second electrically conductive element 7. The second electrically conductive element 7 may for example be a heatsink, preferably combined with the intermediate layer of electric conductive material.

Preferably, the first electrically conductive element 6 is electrically isolated from the second electrically conductive element 7 and/or ground. Preferably the second electrically conductive element 7 is electrically coupled to ground.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lighting apparatus for coupling to an LED driver, the lighting apparatus comprising:
   a plurality of LEDs in a series connection arranged to form an LED string having a first end and a second end;
   a first electrically conductive element thermally coupled to the LED string, wherein the first electrically conductive element is electrically insulated from ground, and wherein the first electrically conductive element is electrically coupled to a first anode of the first end of the LED string;
   a second electrically conductive element electrically coupled to ground and thermally coupled to the first electrically conductive element;
   and
   a capacitor coupled between a last cathode of the second end of the LED string and the first electrically conductive element.

2. The lighting apparatus according to claim 1, wherein the lighting apparatus comprises a printed circuit board, PCB, and wherein the LED string and the capacitor are mounted on the PCB.

3. The lighting apparatus according to claim 2, wherein the LED string and the capacitor are mounted on one side of the PCB and the first electrically conductive element is mounted on another side of the PCB.

4. The lighting apparatus according to claim 1, wherein the electrical connection between the first end of the LED string and the first electrically conductive element comprises a via from the first anode to the first electrically conductive element.

5. The lighting apparatus according to claim 2, wherein the capacitor is electrically coupled to the first electrically conductive element using a via.

6. The lighting apparatus according to claim 2, wherein the PCB is a ceramic PCB.

7. The lighting apparatus according to claim 1, wherein the first electrically conductive element is electrically disconnected from the second electrically conductive element.

8. The lighting apparatus according to claim 1, wherein the first electrically conductive element is a single entity arranged to be thermally coupled to all of the LEDs of the LED string.

9. The lighting apparatus according to claim 1, further comprising a further capacitor, wherein the first electrically conductive element is coupled to a ground return path via the further capacitor.

10. The lighting apparatus according to claim 2, wherein the first electrically conductive element comprises a copper plane.

11. A lighting system comprising:
   the lighting apparatus according to claim 1; and
   an LED driver for providing a regulated current to the lighting apparatus.

12. The lighting system according to claim 11, wherein the LED driver is arranged to provide a galvanic isolation between an input of the LED driver and an output of the LED driver, wherein the output of the LED driver is coupled to the LED string and the input of the LED driver is coupled to a mains voltage supply, wherein the LED driver further comprises an isolation capacitor placed across the galvanic isolation.

13. The lighting system according to claim 11, wherein the second electrically conductive element is a housing.

14. The lighting system according to claim 13, wherein the housing is coupled to ground.

* * * * *